United States Patent
Roth

(10) Patent No.: US 11,606,154 B2
(45) Date of Patent: Mar. 14, 2023

(54) WIDEBAND SPECTRUM ANALYZER

(71) Applicant: Rohde & Schwarz GmbH & Co. KG, Munich (DE)

(72) Inventor: Alexander Roth, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 17/158,827

(22) Filed: Jan. 26, 2021

(65) Prior Publication Data
US 2022/0239392 A1    Jul. 28, 2022

(51) Int. Cl.
*H04B 17/30* (2015.01)

(52) U.S. Cl.
CPC .................................. *H04B 17/30* (2015.01)

(58) Field of Classification Search
None
See application file for complete search history.

(56) References Cited

U.S. PATENT DOCUMENTS

| | | | |
|---|---|---|---|
| 4,459,542 A | 7/1984 | Terrier et al. | |
| 6,495,998 B1 * | 12/2002 | Terreault | H03H 7/0161 324/76.19 |
| 7,702,305 B2 | 4/2010 | Earls | |
| 2006/0271318 A1 | 11/2006 | Mar | |
| 2008/0096489 A1 | 4/2008 | He et al. | |
| 2009/0098847 A1 | 4/2009 | Noujeim | |
| 2011/0202316 A1 | 8/2011 | Crooks | |
| 2018/0083816 A1 | 3/2018 | Bolstad et al. | |
| 2020/0326362 A1 * | 10/2020 | Guddeti | G01R 23/173 |

FOREIGN PATENT DOCUMENTS

| | | | |
|---|---|---|---|
| CN | 110113067 A * | 8/2019 | |
| EP | 1050759 A2 | 11/2000 | |
| EP | 2518518 A2 | 10/2012 | |
| EP | 2596582 A1 | 5/2013 | |

(Continued)

OTHER PUBLICATIONS

Oppenheim et al. (Digital Signal Processing, 1975, pp. 26-30). (Year: 1975).*

(Continued)

*Primary Examiner* — Adolf Dsouza
(74) *Attorney, Agent, or Firm* — Christensen O'Connor Johnson Kindness PLLC

(57) ABSTRACT

A wideband spectrum analyzer includes at least one signal input, and at least one signal channel with a first filter module and a second filter module. The first filter module and the second filter module are connected with the at least one signal input downstream of the at least one signal input in a series connection. The first filter module includes first switches, and several different highpass filters being arranged in a parallel connection. The first switches are configured to selectively connect one of the highpass filters with an input of the first filter module and an output of the first filter module. The second filter module includes second switches, and several different lowpass filters being arranged in a parallel connection. The second switches are configured to selectively connect one of the lowpass filters with an input of the second filter module and an output of the second filter module.

21 Claims, 1 Drawing Sheet

(56) References Cited

FOREIGN PATENT DOCUMENTS

JP            2000321140 A       11/2000
WO         2012/009757 A1       1/2012

OTHER PUBLICATIONS

Chen, S. and Shimin Zhu, "4-Channel Baseband Real-time Spectrum Analyzer for Crosstalk Measurement," IEEE Intern. Symposium on Microwave Antenna, Propagation, and EMC Technologies (MAPE), Oct. 24, 2017, pp. 256-259.

Liu, Roy, "Crosstalk Analysis of the Quad Independent Channel HOTLink II™ Device," Cypress, AN4047, pp. 1-13.

* cited by examiner

WIDEBAND SPECTRUM ANALYZER

FIELD OF THE DISCLOSURE

Embodiments of the present disclosure relate to a wideband spectrum analyzer.

BACKGROUND

In the state of the art, signal and spectrum analyzers are known that can be used for different testing purposes, wherein different signal and spectrum analyzers are used for different applications or application scenarios.

Generally, the signal and spectrum analyzers are typically used by users working in the development, production, installation and servicing of radio frequency (RF) systems, for instance communication systems. In some embodiments, the signal and spectrum analyzers characterize components of the RF system or the RF system itself. Typical measurement tasks of signal and spectrum analyzers include standard-compliant spectrum emission mask measurements as well as spurious emission and adjacent channel leakage ratio (ACLR) measurements. Moreover, measurements for electromagnetic interference (EMI) diagnostics, phase noise, noise figure, analog demodulation and vector signal analysis may also be done by signal and spectrum analyzers.

However, the capacity of the signal and spectrum analyzers is limited with regard to the bandwidth of the signals processed such that different signal and spectrum analyzers are needed. Since different signal and spectrum analyzers are necessary to cover the several possible applications or rather application scenarios, the overall costs are high. Moreover, test procedures require high manual efforts due to connecting the different signal and spectrum analyzers with the device under test for testing purposes.

Accordingly, there is a need for a more cost-efficient solution in order to cover the different application scenarios.

SUMMARY

Embodiments of the present disclosure provide a wideband spectrum analyzer with good image suppression and dynamic range. In an embodiment, the wideband spectrum analyzer comprises at least one signal input, and at least one signal channel with a first filter module and a second filter module. The first filter module and the second filter module are connected with the at least one signal input downstream of the at least one single input in a series connection. The first filter module comprises first switches. The first filter module further comprises several different highpass filters being arranged in a parallel connection, wherein the first switches are configured to selectively connect one of the highpass filters with an input of the first filter module and an output of the first filter module. The second filter module comprises second switches. The second filter module further comprises several different lowpass filters being arranged in a parallel connection, wherein the second switches are configured to selectively connect one of the lowpass filters with an input of the second filter module and an output of the second filter module.

Accordingly, a single instrument, namely a single wideband signal and spectrum analyzer, is provided that has a selectable preselector concerning the bandwidth. The preselector is set by the respective highpass filters and lowpass filters selected for processing the signal. In some embodiments, the flexible combination of the different highpass filters and the different lowpass filters allows for a much more flexible setting of the respective bandwidth. The respective filters, namely the highpass filters and the lowpass filters, can be controlled independently such that the bandwidth of the preselector, namely the selected filters of the filter modules, can be chosen accordingly with regard to the respective application (scenario).

The independent selection of the highpass filters and the lowpass filters generally allows an improved image and/or spur suppression for narrowband applications without limiting the wideband characteristics of the spectrum analyzer significantly. Hence, one single signal and spectrum analyzer is available that provides maximum bandwidth, namely no limited wideband characteristics, and high spur and/or image rejection simultaneously, which depends on the setting of the highpass filters and the lowpass filters, namely the setting of the preselector.

The switches associated with the respective filter modules, namely the first filter module and the second filter module, ensure that the different highpass filters and/or lowpass filters arranged in a parallel connection respectively can be activated appropriately for filtering the signal received. Accordingly, the respective switches may be controlled such that one of the several different highpass filters of the first filter module is selected for processing the respective signal. In other words, the respective filter selected is embedded into the signal line via which the signal received is processed. In a similar manner, one of the several different lowpass filters is selected by the respective switching position of the second switches, which is used to process the respective signal received by the second filter module.

Since the first filter module and the second filter module each comprise several different filters, the first switches and/or the second switches may be established by multiplexers respectively. The multiplexer may connect an input or rather an output of the respective filter module with the several different filters of the corresponding filter module depending on the switching position.

The first filter module and the second filter module are connected with the at least one signal input in a series connection such that the at least one signal input may be connected with the first filter module which in turn is connected with the second filter module. Hence, a signal received via the at least one signal input is routed via the first filter module to the second filter module. Alternatively, the at least one signal input is connected with the second filter module which in turn is connected with the first filter module such that the signal received via the at least one signal input is routed via the second filter module to the first filter module. However, both filter modules are located downstream of the at least one signal input.

The different highpass filters are different with regard to the frequency threshold provided by the respective highpass filter, for example the frequency cutoff.

In a similar manner, the different lowpass filters are different with regard to their frequency threshold or rather frequency cutoff.

For instance, the highpass filters have a frequency threshold of 6 GHz, 10 GHz, 14 GHz, 18 GHz or 22 GHz. The respective lowpass filters may have a frequency cutoff at 10 GHz, 14 GHz, 18 GHz, 22 GHz or 26 GHz.

Accordingly, the several different highpass filters and the several different lowpass filters together may cover in an embodiment a bandwidth of 20 GHz, for example between 6 GHz and 26 GHz.

An aspect provides that the first switches and the second switches are configured to operate independently of each other. Therefore, one of the several highpass filters may be actively selected or rather changed while the selected lowpass filter is maintained. In other words, the switching position of the first switches is changed in order to use another one of the several different highpass filters for filtering the signal received wherein the second switches remain in their previous switching position, resulting in the same lowpass filter being embedded. Accordingly, the filter modules can be set individually with respect to the application scenario.

In some embodiments, the selection of the respective filter means that the respective switch assumes a switching position such that the signal is routed via the switch to the respective filter selected which processes the signal accordingly.

Another aspect provides that the wideband spectrum analyzer further comprises a control module having one or more circuits configured to control the first switches and the second switches based on a set output bandwidth. The respective switches are controlled in a defined manner such that the respective switches assume a defined switching position. The respective switching positions of the switches depend on the output bandwidth that has been set previously, namely the desired or intended bandwidth. Hence, the control module is able to select one appropriate highpass filter from the several different highpass filters provided by the first filter module as well as one appropriate lowpass filter from the several different lowpass filters provided by the second filter module, respectively.

Generally, the output bandwidth corresponds to the bandwidth of the signal that has been processed by both filter modules.

The output bandwidth may be set manually via a user interface of the spectrum analyzer such that an operator or user may set the output bandwidth intended.

Alternatively, the output bandwidth is set automatically, based on a pre-defined setting, for instance a certain testing or measurement mode that has been activated, for instance manually or automatically due to a testing scenario performed.

In addition, the output bandwidth may be set automatically based on an automatic recognition of a device under test connected with the spectrum analyzer. The device under test may output the radio frequency (RF) signal that is forwarded to the spectrum analyzer for analyzing purposes.

Furthermore, the output bandwidth may be set automatically based on an automatic recognition of the RF signal received, for example any characteristics of the RF signal determined previously.

A further aspect provides that the first filter module is arranged upstream of the second filter module. Accordingly, the first filter module processed the signal received via the signal input, thereby generating a first filtered signal that is forwarded to the second filter module for further filtering. This order of the filter modules ensures that harmonics can be avoided in the output signal outputted by both filter modules.

In some embodiments, the wideband spectrum analyzer further comprises an analog-to-digital converter downstream of the first filter module and downstream of the second filter module. The analog-to-digital converter (ADC) is arranged downstream of both filter modules that are connected in series. The ADC receives the signal that has previously been processed by both filter modules, namely the output signal. The ADC is used to sample the signal received accordingly. Hence, the ADC is used for digitizing the signal received that has previously been processed by both filter modules. The ADC may have a sampling frequency of 24 GHz.

Another embodiment provides that the wideband spectrum analyzer further comprises at least one mixer downstream of the filter modules. The at least one mixer is configured to convert an output signal of the filter modules to a predetermined intermediate frequency (IF) band. The at least one mixer is also connected with a local oscillator that provides a respective local oscillator signal. The local oscillator signal may have a frequency between 10 to 26 GHz, for example. The frequency range of the local oscillator signal corresponds to the frequency range covered by the lowpass filters. In some embodiments, the mixer is located between the filter module and the ADC such that the ADC digitizes an IF signal that is outputted by the mixer.

In general, the output signal of the filter modules corresponds to the output signal of the downstream filter module that has previously passed both filter modules.

As mentioned above, the highpass filters and the lowpass filters can be controlled independently such that the highpass filter and the lowpass filter embedded in the signal line can be selected appropriately in order to choose the bandwidth of the preselector, depending on the application.

For applications with a high dynamic range, a narrow combination of the highpass filters and the lowpass filters may be used. Accordingly, the load on subsequent processing circuits of the spectrum analyzer, for instance the mixer, can be limited in case of additional signals received via the at least one signal input of the spectrum analyzer. Moreover, this allows to use a lower intermediate frequency (IF) which can be processed further in a simplified manner or rather with a better performance of the ADC.

For applications requiring a wide bandwidth, the highpass filters and the lowpass filters are set such that a modulated spectrum is not disturbed by the respective filter responses of the filters used.

According to another embodiment, the wideband spectrum analyzer further comprises an IQ mixing module downstream of the filter modules. The IQ mixing module includes one or more circuits configured to convert an output signal of the filter modules to a predetermined intermediate frequency (IF) band. Thus, the mixing stage of the wideband spectrum analyzer is established by the IQ mixing module. The IQ mixing module may comprise two mixer units, also called IQ mixers, that provide the I-signal and the Q-signal, respectively. The IQ mixers are located in the analog domain. Hence, the IQ mixers are analog ones. The analog IQ mixers receive a local oscillator signal from at least one local oscillator.

The IQ mixers may receive the respective local oscillator that has previously been processed by a 90° hybrid. The local oscillator signal is split by the 90° hybrid in order to generate the required phase shift between the two signals that are forwarded to the IQ mixers, respectively.

In general, the IQ mixing module ensures that an additional image rejection is provided, thereby ensuring an improved image suppression. In some embodiments, only one side-band is converted, which provides the additional image rejection.

The wideband spectrum analyzer may further comprise an analog-to-digital converter downstream of the filter modules and downstream of the IQ mixing module. The predetermined intermediate frequency band may be located within the first Nyquist zone of the analog-to-digital converter (ADC). Hence, the signal can be sampled accurately. The first Nyquist zone ranges from 0 to the half of the sampling frequency of the ADC.

Generally, the second Nyquist zone might be also of interest. Thus, the predetermined intermediate frequency band may also be located within the second Nyquist zone of the analog-to-digital converter (ADC).

Another aspect provides that the wideband spectrum analyzer further comprises a connection interface or module downstream of the IQ mixing module. The connection module is configured to selectively connect at least one of an I-channel of the IQ mixing module or a Q-channel of the IQ mixing module with the analog-to-digital converter. The connection module may also comprise at least one 90° hybrid that is located downstream of the IQ mixers, for example via intermediate switches. The 90° hybrid may be used, depending on the switching positions of the intermediate switches, to recombine the IF signals outputted by the IQ mixers.

In general, a complex mixer is established that may suppress the image receiving frequency by additional 30 dB.

Another aspect provides that the wideband spectrum analyzer further comprises a second analog-to-digital converter downstream of the filter modules and downstream of the IQ mixing module. The connection module is configured to selectively connect at least one of an I-channel of the IQ mixing module and a Q-channel of the IQ mixing module with the second analog-to-digital converter. Generally, the second analog-to-digital converter may be associated with a second signal input or rather a second channel. Nevertheless, the ADCs associated with the signal inputs or rather the signal channels may be interconnected with each other via the IQ mixing modules, for example the associated connection modules. However, the bandwidth of both ADCs can be combined when using only one signal channel, also called receiving, of the wideband spectrum analyzer. Thus, an ultra-wide bandwidth mode is provided by the spectrum analyzer.

For instance, the bandwidth of both ADCs can be combined to more than 16 GHz when using only one signal path.

A further aspect provides that the connection module is configured to selectively connect the I-channel of the IQ mixing module with one of the analog-to-digital converters, and to selectively connect the Q-channel of the IQ mixing module with the other one of the analog-to-digital converters. Therefore, the connection module is set accordingly in order to ensure that the bandwidth provided by the spectrum analyzer is maximized. The I-signal outputted by one of the IQ mixers via the I-channel is routed directly to the first ADC, whereas the Q-signal outputted by the other IQ mixer of the IQ mixing module via the Q-channel is routed directly to the second ADC. At the respective inputs of the ADCs, a complex baseband signal is provided such that, for example, 16 GHz of bandwidth can be received for signal analysis. The spur free dynamic range is limited by the quality of the analog IQ mixer(s).

The wideband spectrum analyzer may also comprise an equalizer module downstream of the analog-to-digital converters. The equalizer module includes one or more circuits configured to correct an imbalance between output signals of the analog-to-digital converters, for example an IQ imbalance. Hence, the equalizer module is used for equalizing amplitude response and phase response of the respective IQ mixers. For this purpose, the equalizer module may comprise several finite impulse response filters (FIR filters). Generally, the equalizer module is configured to minimize or compensate crosstalk of the IQ mixers of the IQ mixing module.

Since the equalizer module is located downstream of the ADCs, the equalizer module is provided in the digital domain.

Moreover, an amplifier module may be arranged between the first filter module and the second filter module. The amplifier module includes one or more circuits configured to amplify a signal outputted by the first filter module. The amplifier module may compensate any losses that occur in the processing chain of the spectrum analyzer.

In addition, the first signal channel may comprise a bypass-line connected to the at least one signal input. The bypass-line is configured to bypass the first filter module and the second filter module. The bypass-line may directly route a signal received via the at least one signal input to the analog-to-digital converter without routing the respective signal along the filter modules (and the mixer or rather IQ mixing module).

Generally, a direct sampling of a first frequency band can be done by the spectrum analyzer due to the bypass-line, namely a sampling without conversion by the mixer or rather the IQ mixing module. This can be ensured due to the performance of the analog-to-digital converter that may sample a first frequency band of up to several GHz, for instance up to 4 GHz or even 10 GHz, in the first Nyquist zone.

Accordingly, the ADC may be configured to sample signals up to 10 GHz. Thus, the first band forwarded to the ADC may encompass 10 GHz thereby being located within the first Nyquist zone of the ADC.

Further, an amplifier module may be integrated in the bypass-line, wherein the amplifier module is also used to compensate any losses that occur in the respective processing chain.

According to another embodiment, the wideband spectrum analyzer comprises a second signal channel with a third filter module and a fourth filter module. The third filter module and the fourth filter module are connected with the at least one signal input in a series connection. The third filter module comprises third switches. The third filter module further comprises several different highpass filters being arranged in a parallel connection, wherein the third switches are configured to selectively connect one of the highpass filters with an input of the third filter module and an output of the third filter module. The fourth filter module comprises fourth switches. The fourth filter module further comprises several different lowpass filters being arranged in a parallel connection, wherein the fourth switches are configured to selectively connect one of the lowpass filters with an input of the fourth filter module and an output of the fourth filter module. In some embodiments, the third and fourth filter modules are established in an essentially analog manner to the first and second filter modules. For instance, the different filters used by the third filter module equal the ones used by the first filter module. In a similar manner, the different filters used by the fourth filter module equal the filters used by the second filter module. Accordingly, the respective filter modules may be established in a similar manner.

Generally, the first signal channel and the second signal channel may be established in a substantially equal manner. In some embodiments, both signal channels each comprise two different filter modules, namely a filter module with highpass filters and a filter module with lowpass filters, as well as a mixer or rather an IQ mixing module. The respective filter modules may be established in a similar manner concerning the frequency thresholds of the individual filters arranged in parallel connection within the respective filter modules.

However, both signal channels may have a common connection interface or module that ensures to direct the respective signals to the ADCs, wherein the signals have been processed by the respective filter modules and the mixers or rather IQ mixing modules previously. The exact routing of the signals to the ADC(s) for sampling purposes depends on the respective application scenario, for instance a narrowband setting or a wideband setting, for example with a bandwidth higher than 8 GHz, for example 10 GHz.

According to an aspect, a first signal input and a second signal input are provided, wherein the first signal channel and the second signal channel are each connected with one of the first signal input and the second signal input. The first signal input is connected with the first signal channel and the second signal input is connected with the second signal channel. Both signal inputs or rather signal channels may be used for processing different signals simultaneously. Furthermore, one of both signal channels may be used as a trigger channel for the other one. For instance, the trigger channel has a different frequency and/or level setting compared to the signal channel used for measurement.

According to a further aspect, the wideband spectrum analyzer comprises a calibration module. The calibration module includes one or more circuits configured to synchronize the first signal input and the second signal input with respect to phase. Therefore, it can be ensured that the first signal input and the second signal input are phase coherent, thereby providing phase coherent signals. The calibration module may send a calibration signal to the respective signal channels or signal inputs. Therefore, a self-alignment of the wideband spectrum analyzer can be ensured.

The calibration module can be used to reduce or even avoid non-ideal behavior of the spectrum analyzer, for example its mixer or rather IQ mixing module, by self-aligning the respective components.

The calibration signal may be a comb signal.

Further, the wideband spectrum analyzer is configured to measure at different frequencies in a first operation mode. Since the wideband spectrum analyzer may comprise two different signal inputs and signal channels associated therewith, signals at different frequencies may be measured simultaneously in the first operation mode. The respective signals can be processed independently of each other via the signal channels.

Another aspect provides that the wideband spectrum analyzer is configured to perform cross-correlation measurements in a second operation mode. Thus, the same signal may be sent to both signal channels of the wideband spectrum analyzer in order to gather information concerning cross-correlation. This can be used for error vector magnitude (EVM) measurements.

In general, the wideband spectrum analyzer may comprise two or more signal channels for coherent or independent measurements on the two or more signal inputs.

The phase stability between the two or more signal channels is important when performing coherent measurements. Therefore, the local oscillator signal of a single local oscillator may be split up and used for the respective mixers or rather the IQ mixing modules in this respective operation mode. The mixers or rather IQ mixing modules may be thermally coupled with each other in order to avoid any temperature effects.

Further, the clocks associated with the ADCs of the two or more signal channels are also coherent, namely as coherent as possible. For instance, the respective clock signals forwarded to the ADCs may be derived from a single common reference source.

However, it is also possible to use different clocks and different local oscillator signals for the at least two signal channels, for instance for frequency independent measurements on the at least two signal channels.

Generally, the wideband signal and spectrum analyzer provides high spur rejection as well as image rejection.

In addition, phase coherent measurements are enabled provided that the wideband signal and spectrum analyzer has two or more signal inputs and signal channels.

The bandwidth of two signal channels may be combined when only one signal input is used, resulting in an improved overall bandwidth, as two ADCs are used for sampling the signal received via the single signal input.

Furthermore, measurements at different frequencies can be performed simultaneously.

Moreover, the wideband spectrum analyzer may be configured to directly sample a first frequency band without at least one of conversion and filtering. As mentioned above, a direct sampling of the first frequency band, namely of signals having low frequency, can be done by the wideband spectrum analyzer. In some embodiments, this can be ensured by the bypass-line that forwards the respective signal directly to the ADC. Accordingly, a sampling without conversion by the mixer or rather the IQ mixing module as well as a sampling without filtering by any of the filter modules may take place. Generally, this can be ensured due to the performance of the analog-to-digital converter that may sample the first frequency band of up to several GHz, for instance up to 4 GHz or even 10 GHz, in the first Nyquist zone. Accordingly, the ADC may be configured to sample signals up to 10 GHz, for example. Thus, the first band forwarded to the ADC may encompass 10 GHz thereby being located within the first Nyquist zone of the ADC.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
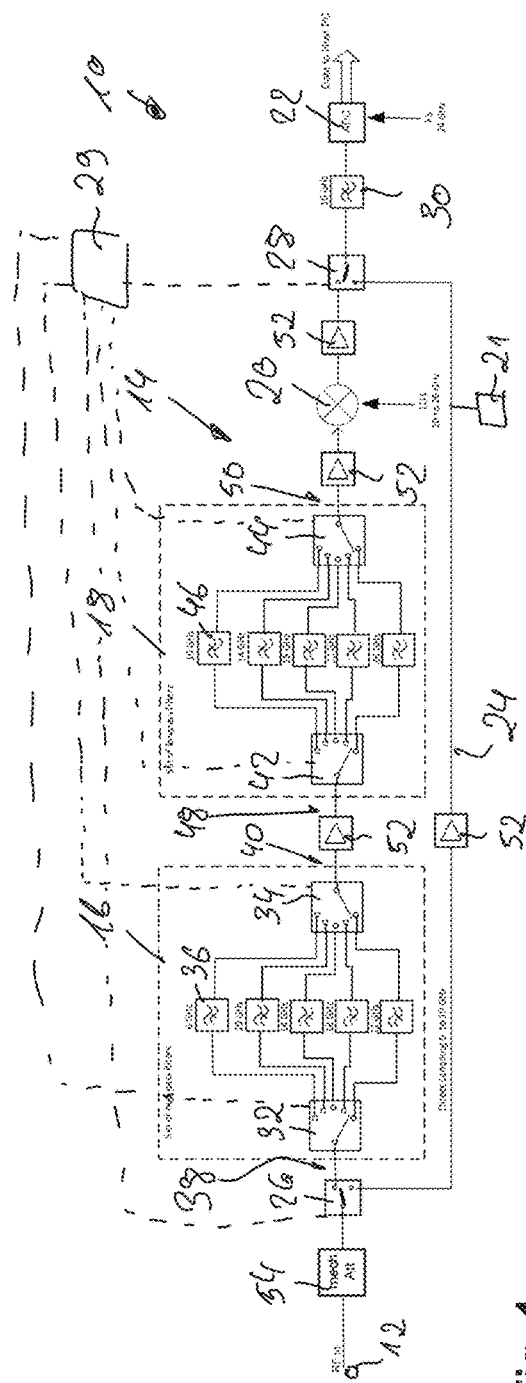
FIG. 1 schematically shows a wideband spectrum analyzer according to a first embodiment of the present disclosure, and FIG. 2 schematically shows a wideband spectrum analyzer according to a second embodiment of the present disclosure.

In FIG. 1, a wideband spectrum analyzer 10 is shown that comprises a signal input 12 via which radio frequency (RF) signal may be inputted for further analyzing purposes. The signal input 12 is connected with a signal channel 14 that comprises several components for processing the RF signal received.

The wideband spectrum analyzer 10 comprises a first filter module 16 as well as a second filter module 18 that are connected with the signal input 12 in a series connection. The filter modules 16, 18 are located downstream of the signal input 12.

In some embodiments, the term "module" or "unit" as used herein, refers to a combination of hardware (e.g. a processor such as an integrated circuit or other circuitry) and software (e.g. machine- or processor-executable instructions, commands, or code such as firmware, programming, or object code). Furthermore, a combination of hardware and software may include hardware only (i.e. a hardware element with no software elements), software hosted at hardware (e.g. software that is stored at a memory and executed or interpreted at a processor), or hardware with the software hosted thereon. In some embodiments, the hardware may, inter alia, comprise a CPU, a GPU, an FPGA, an ASIC, or other types of electronic circuitry.

The wideband spectrum analyzer 10 also comprises a mixer 20 that is located downstream of the filter modules 16 and 18. The mixer 20 is connected with a local oscillator 21 that provides a local oscillator signal that is used for mixing the signal received into an intermediate frequency (IF) band.

An analog-to-digital converter 22 is provided that receives the signal outputted by the mixer 20, namely the intermediate frequency band (IF band). Hence, the ADC 22 is located downstream of the mixer 20. In general, the ADC 22 is used to sample the respective signal received in order to digitize the signal.

The wideband spectrum analyzer 10 further comprises a bypass-line 24 that bypasses the filter modules 16, 18 as well as the mixer 20.

Therefore, two switch units 26, 28 are provided within the first signal channel 14 such that the radio frequency signal received via the signal input 12 can be routed along the filter modules 16, 18 or rather along the bypass-line 24. This depends on the respective switching positions of the switch units 26, 28, which have two different switching positions in the shown embodiment. The switch units 26, 28 are controlled by a control module 29, composed of one or more circuits, for example. The control module 29 is schematically illustrated in FIG. 1.

When controlling the switch units 26, 28 such that the bypass-line 24 is activated, the radio frequency signal is directly routed to the ADC 22 for sampling the radio frequency signal received, namely without any conversion into the IF band by the mixer 20.

Since the ADC 22 has a limited capacity concerning the bandwidth of the signal to be sampled, a bandpass filter 30 is located upstream of the ADC 22 and downstream of the switch unit 28 in order to ensure that the radio frequency (RF) signal directly forwarded to the ADC 22 is limited concerning its bandwidth.

In the other operation mode, the switch units 26, 28 are controlled by the control module 29 such that they route the radio frequency signal received via the signal input 12 along the filter modules 16, 18 and the mixer 20 that mixes the RF signal into the IF band.

Generally, the filter modules 16, 18 together establish a selectable preselector concerning the bandwidth of the RF signal.

Accordingly, the first filter module 16 comprises first switches 32, 34 that are located upstream and downstream of several different highpass filters 36 that are arranged in a parallel connection.

The first switches 32, 34 are also controlled by the control module 29 (illustrated by the dashed lines) such that they selectively connect one of the several different highpass filters 36 with an input 38 of the first filter module 16 and an output 40 of the first filter module 16.

In the shown embodiment, five different highpass filters 36 are provided that each have a cutoff frequency or rather frequency threshold that is different to the one of the others. In some embodiments, the several different highpass filters 36 have a frequency threshold at 6 GHz, 10 GHz, 14 GHz, 18 GHz and 22 GHz.

In some embodiments, the first switches 32, 34 are each established by multiplexers that can be controlled accordingly by the control module 29.

The second filter module 18 is established in a substantially similar manner, as the second filter module 18 also comprises second switches 42, 44 that are located upstream and downstream of several different lowpass filters 46.

The second switches 42, 44 are also configured to selectively connect one of the several different lowpass filters 46 with an input 48 of the second filter module 18 and an output 50 of the second filter module 18. Therefore, the control module 29 also controls the second switches 42, 44 as illustrated by the dashed lines.

Accordingly, the respective filters 36, 46 of the filter modules 16, 18 can be selected independently of each other in order to set the respective filter module 16, 18 appropriately, wherein the respective setting depends on the application (scenario).

The first switches 32, 34 and the second switches 42, 44 can be controlled independently of each other such that each of the highpass filters 36 may be activated or rather embedded into the signal path along which the RF signal runs independently of the currently embedded lowpass filter 46 of the second filter module 18.

Moreover, the wideband spectrum analyzer 10 comprises an amplifier module 52 that is located between the first filter module 16 and the second filter module 18. The amplifier module 52 includes circuitry to compensate for any losses in the processing chain or rather signal path that may occur when processing the radio frequency signal received via the signal input 12. Additionally or alternatively, an amplifier module 52 may be located between the second filter module 18 and the mixer 20 or rather downstream of the mixer 20, for example between the mixer 20 and the switching unit 28. Further, the bypass-line 24 may also comprise an amplifier module 52.

The wideband spectrum analyzer 10 may also have an attenuator 54 that is associated with a frontend of the wideband spectrum analyzer 10 in order to avoid any damage to the components downstream of the frontend.

Accordingly, the radio frequency signal received at the signal input 12 is routed along the bypass-line 24 or rather the signal channel 14, which depends on the respective switching position of the switching units 26, 28.

The bypass-line 24 ensures that a direct sampling of the radio frequency signal received may be performed, namely for a first frequency band. This can be ensured due to the performance of the ADC 22 that is enabled to sample a signal up to several GHz, for example up to 10 GHz, namely in the first Nyquist zone of the ADC 22.

However, in the microwave range of the signal received, a frequency conversion may still be necessary such that the switching units 26, 28 are controlled by the control module 29 accordingly in order to route the RF signal received via the signal input 12 along the filter modules 16, 18.

Depending on a narrowband or rather wideband application, the first and second filter modules 16, 18, for example the first switches 32, 34 and/or the second switches 42, 44, are controlled appropriately in order to embed a certain of the several highpass filters 36 and lowpass filters 46 in the signal path, respectively.

Then, the radio frequency signal passes the respective filters 36, 46 embedded due to the respective switching positions of the first and second switches 32, 34, 42, 44 such that an output signal is outputted at the output 50 of the second filter module 18. The output signal corresponds to a filtered signal that has been filtered by one of the several highpass filters 36 and one of the several lowpass filters 46.

The respective switches 32, 34, 42, 44 are controlled by the control module based on an output bandwidth set, for example a desired or rather intended one, wherein the respective output bandwidth has to be achieved at the output 50 of the second filter module 18. The output bandwidth may be set automatically or manually by a user interacting with a user interface of the wideband signal and spectrum analyzer 10.

The respective signal outputted at the output 50 of the second filter module 18 is forwarded to the mixer 20 that mixes the respective signal with the local oscillator signal into the predetermined IF band.

The IF signal obtained by the mixer 20 is forwarded to the ADC 22 for sampling purposes. The predetermined intermediate frequency band is located within the first Nyquist zone of the analog-to-digital converter 22.

In a low power and/or lower performance application, the second Nyquist zone might also be used.

For example, the sampling frequency of the ADC 22 may be 12 GHz, for example due to less power consumption or less costs of the ADC 22, and a bandpass 6 to 10 GHz is used. Accordingly, the predetermined intermediate frequency band is located within the second Nyquist zone of the analog-to-digital converter 22.

Figure 2:
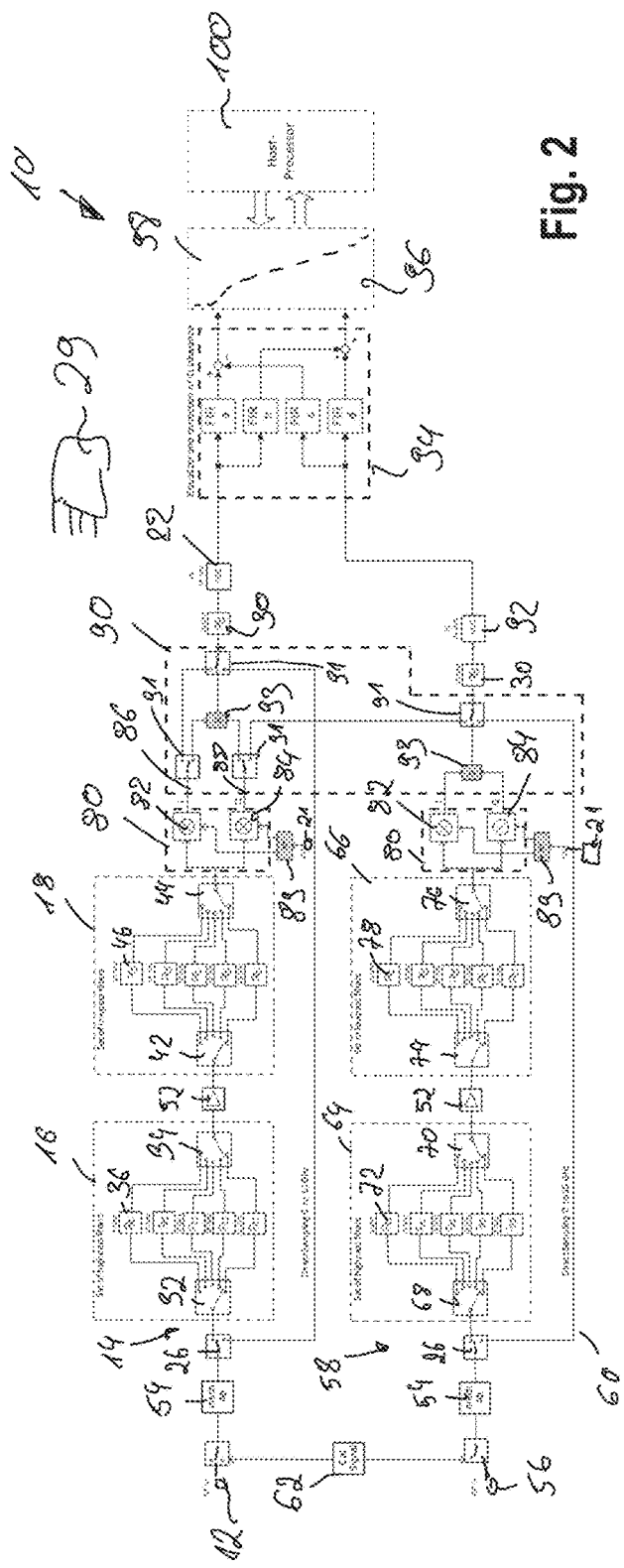

In FIG. 2, a second embodiment of the wideband signal and spectrum analyzer 10 is shown that has several components in common with the first embodiment shown in FIG. 1. Therefore, only the differences are discussed hereinafter in more detail while reference is also made to the explanations given above.

The wideband signal and spectrum analyzer 10 shown in FIG. 2 comprises a second input 56 as well as a second signal channel 58 with a second bypass-line 60.

In addition, a calibration module 62 is provided that is connected to the first signal channel 14 and the second signal channel 58 via switching means, such as one or more switches. Hence, the first signal channel 14 and the second signal channel 58 may be connected with the associated signal input 12, 56 or the calibration module 62 depending on the switching positions of the switching means. The switching means may also be controlled by the switch module 29.

The calibration module 62 includes one or more circuits generally configured to synchronize the first signal input 12 and the second signal input 56, for example first signal channel 14 and the second signal channel 58, in order to ensure that the first signal input 12 and the second signal input 56 are phase coherent.

Accordingly, the switching means provide a calibration mode and an operation mode. In the calibration mode, the first signal channel 14 and the second signal channel 58 are connected with the calibration module 62. In the operation mode, the first signal channel 14 and the second signal channel 58 are connected with the first signal input 12 and the second signal input 56, respectively.

The second signal channel 58 comprises a third filter module 64 as well as a fourth filter module 66 that are connected with the second signal input 56 in a series connection, wherein the fourth filter module 66 is connected downstream of the third filter module 64.

The third filter module 64 comprises third switches 68, 70 as well as highpass filters 72 arranged in a parallel connection between the third switches 68, 70. The third filter module 64 is established in a similar manner as the first filter module 16.

The fourth filter module 66 comprises fourth switches 74, 76 as well as lowpass filters 78 arranged in a parallel connection between the fourth switches 74, 76. The fourth filter module 66 is established in a similar manner as the second filter module 18.

The third and fourth switches 68, 70, 74, 76 are also controlled by the control module 29. The respective control lines of the control module 29 are only schematically indicated for reasons of clarity of FIG. 2.

The second embodiment shown in FIG. 2 differs from the first one shown in FIG. 1 also in that the mixer 20 in the first signal channel 14 has been replaced by an IQ mixing module 80 that comprises a first IQ mixer 82 and a second IQ mixer 84 that associated with an I-channel 86 and a Q-channel 88. Moreover, the first signal channel 14 as well as the second signal channel 58 each comprise an own IQ mixing module 80.

The respective IQ mixers 82, 84 each receive the local oscillator signal from the local oscillator 21, for example a common one. The local oscillator signal is established by a 90° hybrid 89 in order to generate the required phase shift between the two signals that are forwarded to the IQ mixers 82, 84, respectively.

Further, the wideband spectrum analyzer 10 comprises a connection interface or module 90 that is connected with both signal channels 14, 58. The connection module 90 is connected downstream of the IQ mixing modules 80 such that the IF signals are received by the connection module 90 that forwards the IF signals received, namely the I-signal and the Q-signal in an appropriate manner, which depends on the respective application scenario.

The connection module 90 comprises several switches 91 such that the I- and/or Q-signals provided by the IQ mixing modules 80 can be routed in different ways, as will be described in more detail afterwards.

The second embodiment shown in FIG. 2 also differs from the first one shown in FIG. 1 in that two ADCs 22, 92 are provided that are located downstream of the filter modules 16, 18, 64, 66 as well as the IQ mixing modules 80.

In some embodiments, the first signal channel 14 is associated with both ADCs 22, 92 such that depending on the respective operation mode of the wideband spectrum analyzer 10, the I-channel 86 is connected with the first ADC 22, whereas the Q-channel 88 is connected with the second ADC 92. Thus, the overall bandwidth of the wideband spectrum analyzer 10 can be doubled, as two ADCs 22, 92 are used to process the radio frequency signal received, via the first signal input 12.

In some embodiments, the I-signal of the first IQ-mixer 82 associated with the first signal channel 14 is routed via the I-channel 86 to the first ADC 22 directly via the associated switch 91 having a corresponding switching position. In addition, the Q-signal of the second IQ-mixer 84 associated with the first signal channel 14 is routed via the Q-channel 88 to the second ADC 92 directly via the associated switch 91 having a corresponding switching position.

At the inputs of the ADCs 22, 92, a complex baseband signal is provided such that it is possible to receive the baseband signal with a bandwidth of up to 20 GHz for signal analysis.

A respective example may relate to a RF signal at 18 GHz with a bandwidth of 16 GHz. The first filter module 16 may be controlled such that the highpass filter 36 with frequency threshold of 10 GHz is embedded, wherein the second filter module 18 may be controlled such that the lowpass filter 46 with frequency threshold of 26 GHz is embedded. The frequency of the local oscillator signal may correspond to 18 GHz. In this configuration, the ADCs 22, 92 receive the baseband signal with a bandwidth of 16 GHz for signal analysis.

However, the wideband signal and spectrum analyzer 10 may also be used for a narrowband setting, for instance at 16 GHz.

Hence, the first filter module 16 may be controlled such that the highpass filter 36 with frequency threshold of 14 GHz is embedded, wherein the second filter module 18 may be controlled such that the lowpass filter 46 with frequency threshold of 18 GHz is embedded. The frequency of the local oscillator signal may correspond to 23.5 GHz.

The outputs of the IQ-mixers 82, 84, namely the I-signal and the Q-signal, are routed within the connection module 90 via a 90° hybrid 93 to the first ADC 22. In this configuration, the baseband signal forwarded to the ADC 22 has an IF at 7.5 GHz.

Higher order mixing products are well suppressed as the filter modules 16, 18, namely the configurable preselector, attenuates frequencies that could cause spurs.

In narrowband mode no overlap of the preselector is needed. Hence, the wideband signal and spectrum analyzer 10 could be operated in this configuration for signals up to 18 GHz receiving frequency. At higher frequencies, the highpass filter 36 and/or the lowpass filter 46 has to be changed, for example to the highpass filter 36 with 18 GHz threshold and the lowpass filter 46 with 22 GHz threshold.

Moreover, the wideband signal and spectrum analyzer 10 may also be used for a broadband setting, for instance an RF signal at 16 GHz receiving frequency with a bandwidth of 8 GHz.

Then, the first filter module 16 may be controlled such that the highpass filter 36 with frequency threshold of 10 GHz is embedded, wherein the second filter module 18 may be controlled such that the lowpass filter 46 with frequency threshold of 22 GHz is embedded. The frequency of the local oscillator signal may correspond to 22 GHz.

The outputs of the IQ-mixers 82, 84, namely the I-signal and the Q-signal, are routed within the connection module 90 via the 90° hybrid 93 to the first ADC 22. The baseband signal has an IF at 6 GHz plus/minus 4 GHZ.

The connection module 90 is interconnected between the IQ mixing modules 80 associated with the signal channels 14, 58, thereby ensuring to connect the output signals of the IQ modules 80 with the first ADC 22 or rather both ADCs 22, 92, depending on the respective operation scenario.

Accordingly, the connection module 90 is configured to selectively connect the I-channel 86 with the first ADC 22 and/or the Q-channel 88 with the first ADC 22. However, the connection module 90 is also configured to selectively connect the I-channel 86 with the first ADC 22 and the Q-channel 88 with the second ADC 92 that is usually associated with the second signal channel 58.

In addition, the wideband signal and spectrum analyzer 10 comprises an equalizer module 94 that is located downstream of the ADCs 22, 92. The equalizer module 94 includes one or more circuits configured to equalize or rather correct an imbalance between signals of the respective ADCs 22, 92, for example IQ imbalances introduced by the IQ-mixers 82, 84. Hence, cross-talk of the IQ-mixers 82, 84 can be compensated. The equalizer module 94 comprises several finite impulse response filters (FIR filters) that interconnect the signal paths associated with the ADCs 22, 92.

The equalizer module 94 is connected via its output with a memory 96 and/or a data processing module 98. The sampled data is forwarded to the memory 97 and/or the data processing module 98 such that the data samples can be stored or rather post-processed accordingly.

In addition, a host processor 100, such as a processor circuit, a computer circuit, central processing unit, etc., may be provided that interacts with the memory 96 and/or the data processing module 98, thereby controlling further processing.

Generally, the switch module 29 may control all switches, switch units and/or switching means, for example depending on the respective operation mode.

The wideband signal and spectrum analyzer 10 shown in FIG. 1 may also comprise more than one signal channel 14 and/or signal input 12.

In a similar manner, the wideband signal and spectrum analyzer 10 shown in FIG. 2 may comprise more than two signal channels 14, 58 and/or signal inputs 12, 56.

In some embodiments, the wideband signal and spectrum analyzer 10 comprising two or more signal channels 14, 58 and/or signal inputs 12, 56 may be used to measure at different frequencies in a first operation mode, namely signals fed to the different signal inputs 12, 56. The respective signals can be processed independently of each other via the signal channels 14, 58.

Further, the wideband signal and spectrum analyzer 10 can perform cross-correlation measurements in a second operation mode. The same signal may be sent to both signal channels 14, 58 of the wideband signal and spectrum analyzer 10 in order to gather information concerning cross-correlation. This can be used for error vector magnitude (EVM) measurements. The same signal may be provided by an external source or rather the calibration module 62.

In general, the wideband signal and spectrum analyzer 10 provides a high flexibility concerning the filters applied for processing narrowband and wideband signals.

Certain embodiments disclosed herein, for example the respective module(s), unit(s), mixer(s), ADC(s), filter(s), switch(es), multiplexer(s), etc., utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof.

In an embodiment, circuitry includes hardware circuit implementations (e.g., implementations in analog circuitry, implementations in digital circuitry, and the like, and combinations thereof). In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

In some examples, the functionality described herein can be implemented by special purpose hardware-based computer systems or circuits, etc., or combinations of special purpose hardware and computer instructions.

Of course, in some embodiments, two or more of the aforementioned components, modules or units, or parts thereof, can be integrated or share hardware and/or software, circuitry, etc. In some embodiments, these components, or parts thereof, may be grouped in a single location or distributed over a wide area. In circumstances were the components are distributed, the components are accessible to each other via communication links.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A wideband spectrum analyzer, comprising:
at least one signal input, and
at least one signal channel with a first filter module and a second filter module,
the first filter module and the second filter module being connected with the at least one signal input downstream of the at least one signal input in a series connection,
the first filter module comprising first switches and several different highpass filters being arranged in a parallel connection, wherein the first switches are configured to selectively connect one of the highpass filters with an input of the first filter module and an output of the first filter module,
the second filter module comprising second switches and several different lowpass filters being arranged in a parallel connection, wherein the second switches are configured to selectively connect one of the lowpass filters with an input of the second filter module and an output of the second filter module,
wherein the at least one signal channel comprises a bypass-line connected to the at least one signal input, wherein the bypass-line is configured to bypass the first switches and the several different highpass filters as well as the second switches and the several different lowpass filters.

2. The wideband spectrum analyzer of claim 1, wherein the first switches and the second switches are configured to operate independently of each other.

3. The wideband spectrum analyzer of claim 1, further comprising a control module including one or more circuits configured to control the first switches and the second switches based on a set output bandwidth.

4. The wideband spectrum analyzer of claim 1, wherein the first filter module is arranged upstream of the second filter module.

5. The wideband spectrum analyzer of claim 1, further comprising an analog-to-digital converter downstream of the first filter module and downstream of the second filter module.

6. The wideband spectrum analyzer of claim 1, further comprising at least one mixer downstream of the filter modules, the at least one mixer being configured to convert an output signal of the filter modules to a predetermined intermediate frequency band.

7. The wideband spectrum analyzer of claim 1, further comprising an IQ mixing module downstream of the filter modules, the IQ mixing module including one or more circuits configured to convert an output signal of the filter modules to a predetermined intermediate frequency band.

8. The wideband spectrum analyzer of claim 7, further comprising an analog-to-digital converter downstream of the filter modules and downstream of the IQ mixing module, wherein the predetermined intermediate frequency band is located within a first Nyquist zone of the analog-to-digital converter.

9. The wideband spectrum analyzer of claim 8, further comprising a connection interface downstream of the IQ mixing module, wherein the connection interface is configured to selectively connect at least one of an I-channel of the IQ mixing module and a Q-channel of the IQ mixing module with the analog-to-digital converter.

10. The wideband spectrum analyzer of claim 9, further comprising a second analog-to-digital converter downstream of the filter modules and downstream of the IQ mixing module, wherein the connection interface is configured to selectively connect at least one of the I-channel of the IQ mixing module and the Q-channel of the IQ mixing module with the second analog-to-digital converter.

11. The wideband spectrum analyzer of claim 10, wherein the connection interface is configured to selectively connect the I-channel of the IQ mixing module with one of the analog-to-digital converters, and to selectively connect the Q-channel of the IQ mixing module with the other one of the analog-to-digital converters.

12. The wideband spectrum analyzer of claim 11, further comprising an equalizer module downstream of the analog-to-digital converters, the equalizer module including one or more circuits configured to correct an imbalance between output signals of the analog-to-digital converters.

13. The wideband spectrum analyzer of claim 1, wherein an amplifier module is arranged between the first filter module and the second filter module, the amplifier module including one or more circuits configured to amplify an output signal of the first filter module.

14. The wideband spectrum analyzer of claim 1, further comprising a second signal channel with a third filter module and a fourth filter module,
the third filter module and the fourth filter module being connected with the at least one signal input downstream of the at least one signal input in a series connection,
the third filter module comprising third switches,
the third filter module further comprising several different highpass filters being arranged in a parallel connection, wherein the third switches are configured to selectively connect one of the highpass filters with an input of the third filter module and an output of the third filter module,
the fourth filter module comprising fourth switches,
the fourth filter module further comprising several different lowpass filters being arranged in a parallel connection, wherein the fourth switches are configured to selectively connect one of the lowpass filters with an input of the fourth filter module and an output of the fourth filter module.

15. The wideband spectrum analyzer of claim 14, further comprising a first signal input and a second signal input, wherein the first signal channel and the second signal channel are each connected with one of the first signal input and the second signal input.

16. The wideband spectrum analyzer of claim 15, further comprising a calibration module including one or more circuits configured to synchronize the first signal input and the second signal input with respect to phase.

17. The wideband spectrum analyzer of claim 1, wherein the wideband spectrum analyzer is configured to measure at different frequencies in a first operation mode.

18. The wideband spectrum analyzer of claim 1, wherein the wideband spectrum analyzer is configured to perform cross-correlation measurements in a second operation mode.

19. The wideband spectrum analyzer of claim 1, wherein the wideband spectrum analyzer is configured to directly sample a first frequency band without at least one of conversion and filtering.

20. A wideband spectrum analyzer, comprising:
at least one signal input, and
at least one signal channel with a first filter module and a second filter module, the first filter module and the second filter module being connected with the at least one signal input downstream of the at least one signal input in a series connection,
wherein the first filter module comprises first switches and several different highpass filters being arranged in a parallel connection, the first switches being configured to selectively connect one of the highpass filters with an input of the first filter module and an output of the first filter module,
wherein the second filter module comprises second switches and several different lowpass filters being arranged in a parallel connection, the second switches being configured to selectively connect one of the lowpass filters with an input of the second filter module and an output of the second filter module,
wherein the wideband spectrum analyzer comprises an IQ mixing module downstream of the filter modules, the IQ mixing module including one or more circuits configured to convert an output signal of the filter modules to a predetermined intermediate frequency band.

21. A wideband spectrum analyzer, comprising:
at least one signal input, and
at least one signal channel with a first filter module and a second filter module, the first filter module and the second filter module being connected with the at least one signal input downstream of the at least one signal input in a series connection,
wherein the first filter module comprises first switches and several different highpass filters being arranged in a parallel connection, wherein the first switches are configured to selectively connect one of the highpass filters with an input of the first filter module and an output of the first filter module,
wherein the second filter module comprises second switches and several different lowpass filters being arranged in a parallel connection, the second switches being configured to selectively connect one of the lowpass filters with an input of the second filter module and an output of the second filter module,
wherein the wideband spectrum analyzer comprises a local oscillator that provides a respective local oscillator signal,
wherein the wideband spectrum analyzer comprises a 90° hybrid,
wherein the wideband spectrum analyzer further comprises two IQ mixers located downstream of the filter modules, wherein the two IQ mixers are connected with the local oscillator, and
wherein the IQ mixers receive the respective local oscillator that has previously been processed by the 90° hybrid such that the local oscillator signal is split by means of the 90° hybrid in order to generate a phase shift between the two signals that are forwarded to the IQ mixers, respectively.

* * * * *